United States Patent
Fan

(10) Patent No.: US 7,667,306 B1
(45) Date of Patent: Feb. 23, 2010

(54) LEADFRAME-BASED SEMICONDUCTOR PACKAGE

(75) Inventor: Wen-Jeng Fan, Hsinchu (TW)

(73) Assignee: Powertech Technology Inc., Hsinchu (TW)

( * ) Notice: Subject to any disclaimer, the term of this patent is extended or adjusted under 35 U.S.C. 154(b) by 0 days.

(21) Appl. No.: 12/269,543

(22) Filed: Nov. 12, 2008

(51) Int. Cl.
  *H01L 23/495* (2006.01)
(52) U.S. Cl. .................. 257/668; 257/666; 257/783
(58) Field of Classification Search ............ 257/668, 257/666, 783, 782
  See application file for complete search history.

(56) References Cited

U.S. PATENT DOCUMENTS

| | | | | |
|---|---|---|---|---|
| 5,659,198 | A * | 8/1997 | Okutomo et al. ............ | 257/659 |
| 5,711,543 | A * | 1/1998 | Stokes ....................... | 280/504 |
| 6,036,173 | A * | 3/2000 | Neu et al. .................. | 257/668 |
| 6,388,888 | B1 * | 5/2002 | Seko et al. .................. | 361/767 |
| 6,476,467 | B2 * | 11/2002 | Nakamura et al. .......... | 257/668 |

\* cited by examiner

*Primary Examiner*—S. V Clark
(74) *Attorney, Agent, or Firm*—Muncy, Geissler, Olds & Lowe, PLLC

(57) ABSTRACT

A leadframe-based semiconductor package is revealed, primarily comprising a chip, a plurality of leads of a leadframe, a multi-layer tape, and an encapsulant. The multi-layer tape is attached to the chip and includes an adhesive layer disposed on a dielectric core layer. The internal leads of the leads are partially embedded in the adhesive layer in a manner not to directly contact the dielectric core layer. A bonding interface with a U-shaped profile is formed between the adhesive layer and each internal lead to increase the adhesions of the leads so that the internal leads will not be shifted nor delaminated during molding processes. The concentrated stresses exerted on the internal leads disposed at the corners of the packages will be released and reduced.

14 Claims, 6 Drawing Sheets

LEADFRAME-BASED SEMICONDUCTOR PACKAGE

FIELD OF THE INVENTION

The present invention relates to a semiconductor device, especially to a leadframe-based semiconductor package.

BACKGROUND OF THE INVENTION

Among well-known semiconductor packages, leadframe-based semiconductor packages have been widely implemented by using leadframes as chip carriers. Advanced leadframes have a plurality of metal leads not only for electrical connections but also for carrying chips by extending metal leads onto chip surfaces to eliminate or shrink the dimension of the die pad of a conventional leadframe. The leadframes with shrunk die pads or without die pads for leadframe-based semiconductor packages can be classified into two different package types, Lead-On-Chip (LOC) and Chip-On-Lead (COL), where "Lead-On-Chip" means to attach the leads to the active surface of a chip and "Chip-On-Lead" means to attach the back surface of a chip to the middle sections of the leads. However, no matter it is an LOC package or a COL package, it is very common that chips are attached to the leads of a leadframe by die-attaching tapes and are electrically connected to the leads of a leadframe by bonding wires to meet the requirements of smaller dimensions and lower cost for high-speed applications. Since the chips are attached to the leads of a leadframe by die-attaching tapes, therefore, the stresses exerted on the leads of a leadframe will pass along to other parts of the package and will accumulate at certain locations leading to reliability issues.

As shown in FIG. 1, a conventional leadframe-based semiconductor package 100 is an LOC-type package, primarily comprising a chip 110, a plurality of leads 120 of a leadframe, a multi-layer tape 130, a plurality of bonding wires 140, and an encapsulant 150. The chip 110 has an active surface 111 and a corresponding back surface 112 where a plurality of bonding pads 113 are disposed at the center of the active surface 111. The leads 120 are made of metals. Each lead 120 has an internal lead 121 and an external lead 122 where the internal lead 121 has a first surface 123 away from the chip 110 and a second surface 124 adjacent to the chip 110. The internal leads 121 are extended to the active surface 111 toward the bonding pads 113. The external leads 122 are extended from the sides of the encapsulant 150 which are bent and formed as external terminals for external electrical connections. The leads 120 are attached to the active surface 111 of the chip 110 by the multi-layer tape 130. The bonding pads 113 are electrically connected to the internal leads 121 by the bonding wires 140. The encapsulant 150 is formed by transfer molding to encapsulate the chip 110, the internal leads 121, and the bonding wires 140.

FIG. 2 is the partially enlarged cross-sectional view of a conventional leadframe-based semiconductor package 100 cross-sectioned along a plurality of internal leads 121 of the leads 120 of a leadframe. The multi-layer tape 130 comprises a dielectric core layer 131, a first adhesive layer 132 for die-attaching, and a second adhesive layer 133. Firstly, the second adhesive layer 133 is attached to the internal leads 121 by first bonding where the dielectric layer 131 has no adhesions so that the multi-layer tape 130 is disposed beneath the internal leads 121. During the packaging processes, the second adhesive layer 133 is softened by heating where a downward pressure will exert on the internal leads 121 to make the first adhesive layer 132 adhere to the chip 110. But this re-bonding operation also pushes the internal leads 121 to be more embedded in the second adhesive layer 133 until the second surfaces 124 of the internal leads 121 directly contact the dielectric core layer 131 leading to poor or no adhesions between the second surface 124 of the internal leads 121 and the dielectric core layer 131. Moreover, the adhesions between the internal leads 121 and the multi-layer tapes 130 are only relied on the bonding interface between the second adhesive layer 133 and two corresponding sidewalls of the internal leads 121 leading to easily shifting of internal leads and delamination.

Another issue encountered during packaging processes of a conventional leadframe-based package is the downward pressure exerts on the internal leads 121 is too small where the internal leads 121 do not sink into the second adhesive layer 133 so that the adhesions between the internal leads 121 and the second adhesive layer 133 are totally counted on the planar adhesions on the second surface 124 of the internal leads 121 causing lead shifting leading to electrical short. Especially, the internal leads 121 disposed adjacent to the corners of the package 100 will experience maximum stresses, therefore, if the adhesions between the internal leads 121 and the multi-layer tapes 130 are poor, lead peeling or delamination will occur at the interfaces between the internal leads 121 and the multi-layer tapes 130 leading to poor bond ability of bonding wires. Furthermore, the adhesions between the chip 110 and the first adhesive layer 132 are also poor because of the weak re-bonding pressure.

SUMMARY OF THE INVENTION

The main purpose of the present invention is to provide a leadframe-based semiconductor package by partially embedding the internal leads into the second adhesive layer of the multi-layer tape in a manner not to directly contact the dielectric core layer of the multi-layer tape to form a bonding interface with a U-shaped profile to enhance the adhesions of the leads.

According to the present invention, a leadframe-based semiconductor package is revealed, primarily comprising a chip, a plurality of leads of a leadframe, a multi-layer tape, a plurality of bonding wires, and an encapsulant. The chip has a plurality of bonding pads. Each lead has an internal lead inside the encapsulant. The multi-layer tape is disposed on the chip and consists of a dielectric core layer, a first adhesive layer, and a second adhesive layer opposing to the first adhesive layer where the first adhesive layer is attached to one surface of the chip and each internal lead is partially embedded in the second adhesive layer in a manner not to directly contact the dielectric core layer to form a bonding interface with a U-shaped profile. The internal leads are electrically connected to the bonding pads by the bonding wires. The encapsulant encapsulates the chip, the bonding wires, the multi-layer tapes, and the internal leads.

The leadframe-based semiconductor package revealed according to the present invention has the following advantages and functions:

1. By partially embedding the internal leads into the second adhesive layer of the multi-layer tape on the chip in a manner not to directly contact the dielectric core layer of the multi-layer tape to form a bonding interface with a U-shaped profile, the adhesions of the internal leads can be greatly enhanced. Therefore, the internal leads will not easily be shifted nor delaminated due to the impact of the mold flows during molding processes, moreover, the stresses can be distributed to reduce the stresses concentrated at the internal leads adjacent to the corners of the packages. Since the risk of electrical short between the internal leads are greatly reduced during semiconductor packaging processes by the leadframe-based semiconductor package revealed in the present invention, the internal leads can be designed and disposed in even finer pitches.
2. By using the relationship between the embedded depths and the thickness of the internal leads, not only the concentrated stresses exerted on the internal leads adjacent to the corners of the package can be reduced, but also the contaminations of the second adhesive layer to the wire-bonded surfaces of the internal leads can be avoided.
3. By forming round angles of internal leads at the corners of boning surface, the formation and the embedded depth of the embedded internal leads can be well controlled.
4. By forming punched sharp edges of internal leads away from the boning surface, it can avoid the contaminations of the wire-bonded surfaces of the internal leads by the second adhesive layer. The sharp edges are formed simultaneously with the round angles of the internal leads by punching to reduce the cost of forming the round angles.

DETAIL DESCRIPTION OF THE INVENTION

Please refer to the attached drawings, the present invention is described by means of embodiments below.

Figure 3:
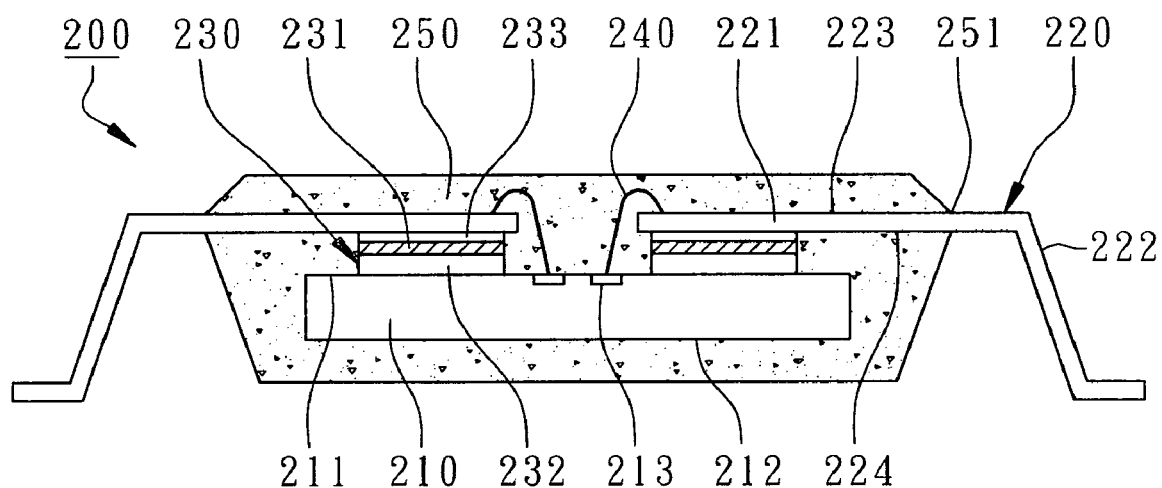
FIG. 3 is the cross-sectional view of a leadframe-based semiconductor package according to the first embodiment of the present invention.

According to the first embodiment of the present invention, a leadframe-based semiconductor package is illustrated in FIG. 3 for a cross-sectional view. The leadframe-based semiconductor package 200 primarily comprises a chip 210, a plurality of leads 220 of a leadframe, a multi-layer tape 230, a plurality of bonding wires 240, and an encapsulant 250.

The chip 210 is made of a semiconductor material and includes various micro active components such as IC, MEMS components, optoelectronic components, etc. The chip 210 has an active surface 211 and a corresponding back surface 212 where a plurality of bonding pads 213 are disposed in a single row or multiple rows on the active surface 211 of the chip 210. In this embodiment, the bonding pads 213 are central pads.

Figure 5:
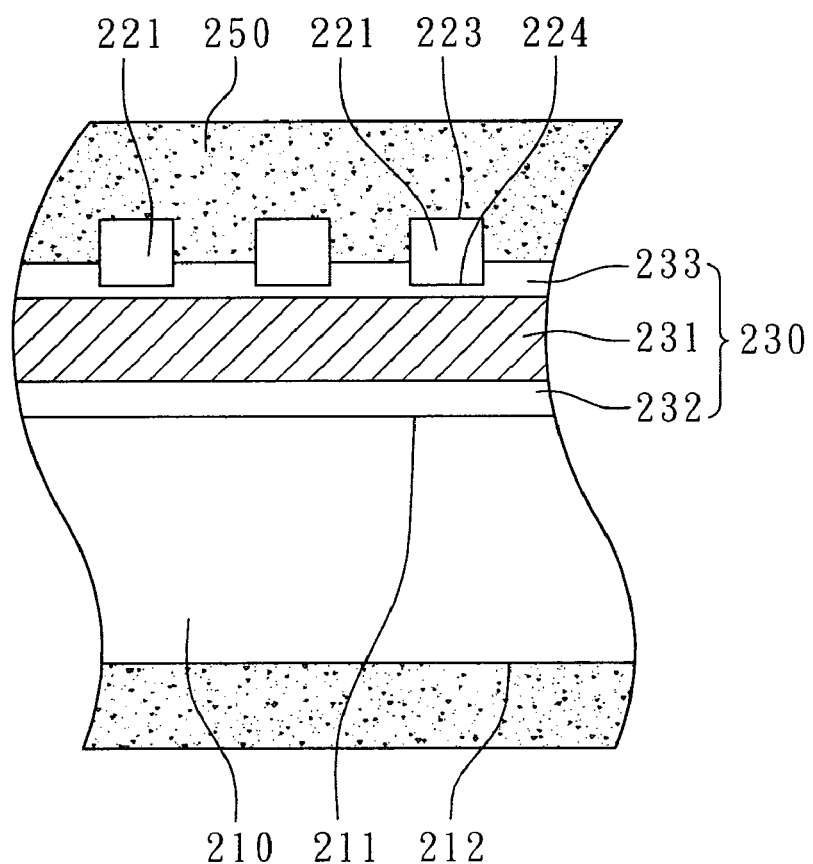
FIG. 5 is the partially enlarged cross-sectional view of the leadframe-based semiconductor package across a plurality of internal leads according to the first embodiment of the present invention.

The leads 220 are parts of a leadframe and made of metal having high electrical and thermal conductivity such as copper, iron, or related alloy. As shown in FIG. 3, the leads 220 are formed on two corresponding sides or on the peripheries of the chip 210. Each lead 220 has an internal lead 221. The internal leads 221 extend toward the bonding pads 213 on the active surface 211 of the chip 210 for wire bonding. Each internal leads 221 has a first surface 223 away from the chip 210 and a corresponding second surface 224 adjacent to the chip 210 (as shown in FIGS. 3 and 5). Furthermore, each lead 220 has an external lead 222 extended from one side 251 of the encapsulant 250 which bent and formed as external electrical connections. The external leads 222 can be bent into gull leads, I-leads, J-leads, or other shapes and disposed at two opposing sides or four sides of the encapsulant 250.

As shown in FIG. 3 again, the multi-layer tape 230 is disposed on the chip 210. The internal leads 221 are attached onto the active surface 211 of the chip 210 by the multi-layer tape 230 to firmly hold the internal leads 221. To be more specific, the multi-layer tape 230 can be disposed in strips and attached to two corresponding sides adjacent to the bonding pads 213 of the chip 210 without covering the bonding pads 213 where the multi-layer tape 230 can enhance the adhesions of the internal leads 221 to achieve higher product reliability.

As shown in FIG. 3 again, the internal leads 221 are electrically connected to the bonding pads 213 by the bonding wires 240 to form electrical interconnections where the bonding wires 240 are formed by wire bonding and are made of gold wires, aluminum wires, copper wires, or other metal wires. The encapsulant 250 is a dielectric thermosetting resin with silica fillers such as Epoxy molding compound (EMC) and is formed by transfer molding. The encapsulant 250 encapsulates the chip 210, the bonding wires 240, the multi-layer tape 230, and the internal leads 221 of the leads 220 so that the internal components are completely isolated from the outside environments away from external impact or contaminations.

Figure 4:
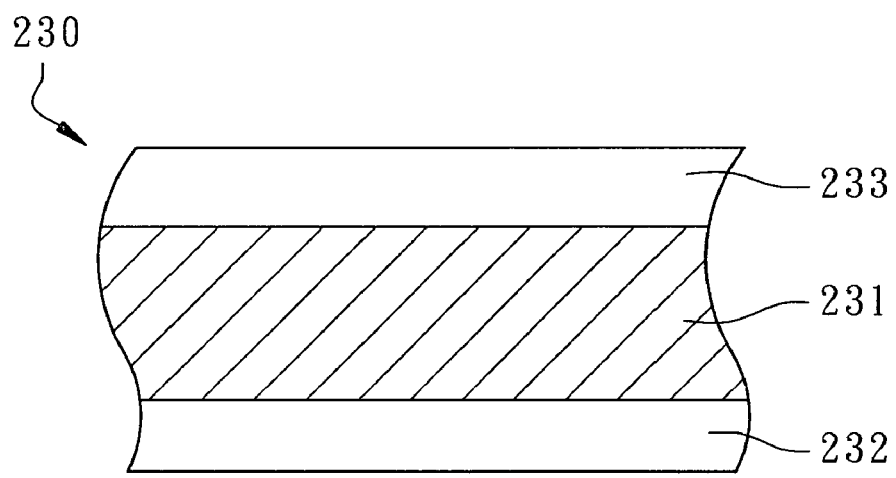
FIG. 4 is the enlarged cross-sectional view of a multi-layer tape utilized in the leadframe-based semiconductor package according to the first embodiment of the present invention.

As shown in FIG. 4, the multi-layer tape 230 has a multi-layer structure, comprising a dielectric core layer 231, a first adhesive layer 232, and a second adhesive layer 233 opposing to the first adhesive layer. The dielectric core layer 231 is made of polyimide for electrical and thermal isolation. The second adhesive layer 233 and the first adhesive layer 232 are thermosetting or thermoplastic materials with adhesions such as epoxy, B-stage paste, or organic resins and are disposed on top and bottom surfaces of the dielectric core layer 231 respectively. The first adhesive layer 232 is used for adhering the chip 210 at first bonding operation. The second adhesive layer 233 is used for adhering the internal leads 221 at second bonding operation. Furthermore, in the present embodiment, the thicknesses of the first adhesive layer 232 and the second adhesive layer 233 are thinner than the one of the dielectric core layer 231. For example, the thicknesses of the first adhesive layer 232 and the second adhesive layer 233 are around 25 μm comparing to the one of the dielectric core layer 231 of 50 μm. Without any limitations, the thickness of the second adhesive layer 233 can be increased to accommodate the internal leads 221 to be partially embedded in the second adhesive layer 233, which will be described in detail later.

Figure 6:
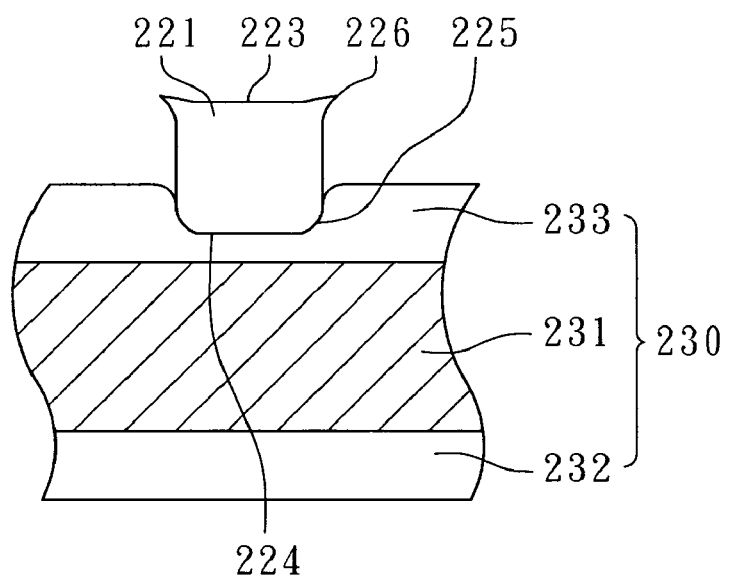
FIG. 6 is the partially enlarged cross-sectional view of the leadframe-based semiconductor package across one internal lead according to the first embodiment of the present invention.

As shown in FIG. 5, the first adhesive layer 232 is attached to the active surface 211 of the chip 210 at the first bonding operation. Additionally, the internal leads 221 are partially embedded in the second adhesive layer 233 at the second bonding operation in a manner not to directly contact with the dielectric core layer 231 to form a bonding interface with a U-shaped profile, as shown in FIG. 5 and FIG. 6, to increase the adhesions of the internal leads 221. In a preferable embodiment, the embedded depth of the internal leads 221 into the second adhesive layer 233 does not exceed half of the thickness of the internal leads 221. To be more specific, as shown in FIG. 5, the embedded depth of the internal leads 221 ranges from 5 μm to 20 μm. In other words, the second adhesive layer 233 adheres to the second surface 224 of the internal leads 221 and to parts of the corresponding sidewalls between the first surface 223 and the second surface 224. Therefore, the internal leads 221 will not easily shift nor delaminate due to the impact of the mold flows during molding processes to eliminate the risk of electrical short between the internal leads 221 during semiconductor packaging processes. In more practical applications, the internal leads 221 can be designed and disposed in finer pitches to achieve higher densities of bonding wires.

Preferably, the partially embedding of the internal leads 221 can avoid the directly contact of the internal leads 221 with the dielectric core layer 231 leaving a bonding gap ranging from 5 μm to 20 μm. The gap is the thickness of the second adhesive layer 233 between the internal leads 221 and the dielectric core layer 231 so that the bottom surfaces of the internal leads 221 have good adhesions to the second adhesive layer 233 with low-modulus stresses.

The embedded depth of the internal leads 221 embedded in the second adhesive layer 233 can be controlled by the tape attaching process during leadframe manufacturing and the attaching forces and time of a die-attaching machine during packaging processes. Through the relationship between the embedded depth and the thickness of the internal leads 221, the concentrated stresses exert on the internal leads 221 disposed at the corners of the packages can be reduced and distributed and the contaminations of the second adhesive layer 233 to the wire-bonding surfaces of the leads can be avoided.

As shown in FIG. 6, preferably, the internal leads 221 have a plurality of round angles 225 formed at a plurality of corners of the bonding interfaces where the round angles 225 are arcs to enhance the formation and control of the embedded internal leads 221.

As shown in FIG. 3 and FIG. 6, the bonding wires 240 are bonded onto the first surfaces 223 of the internal leads 221 away from the bonding interfaces with U-shaped profiles. As shown in FIG. 6, the internal leads 221 may further have a plurality of punched sharp edges 226 formed around the first surface 223 which are the surfaces of the internal leads 221 without embedded into the second adhesive layer 233 for wire-bonding connections. To be more specific, the punched sharp edges 226 are extended toward the first surfaces 223 and slightly bent upwards to avoid the contaminations of the second adhesive layer 233 to the wire-bonded surfaces. Moreover, the punched sharp edges 226 and the round angles 225 are formed at the same time to reduce the formation cost of the round angles 225.

Figure 7A:
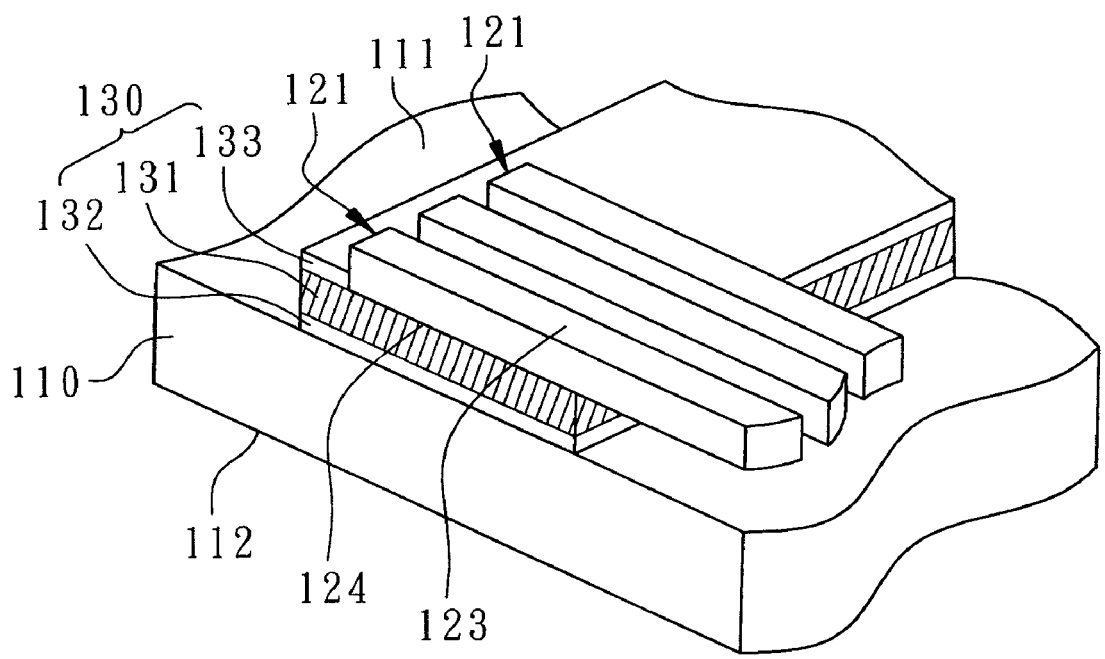
FIG. 7A is the partially enlarged three-dimensional cross-sectional view of some components of a conventional leadframe-based semiconductor package.
Figure 7B:
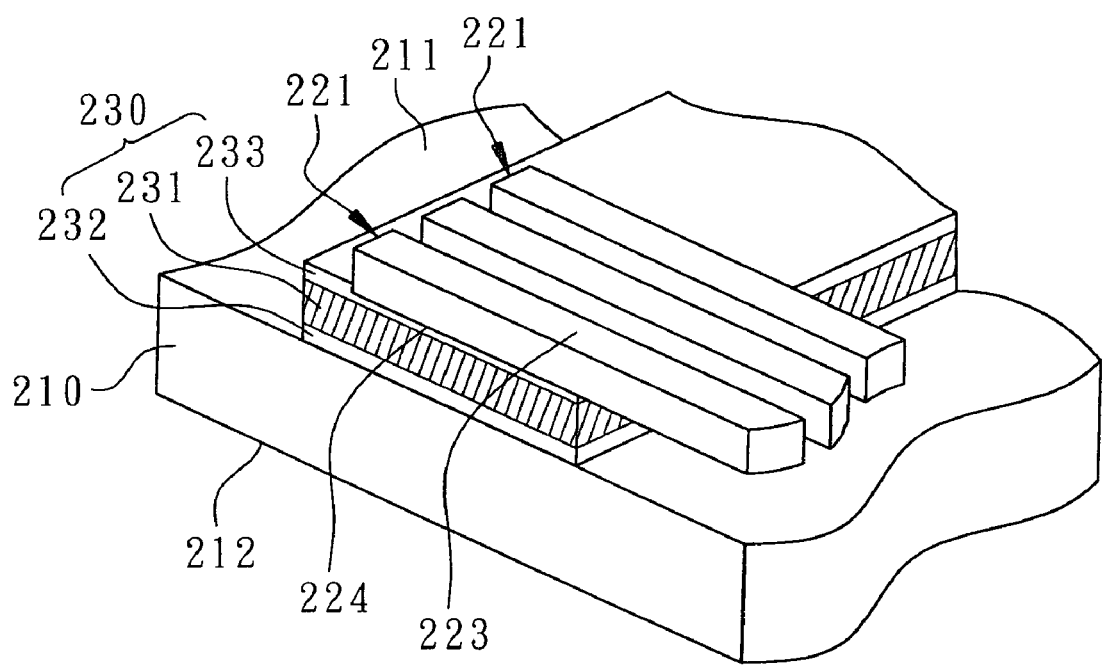
FIG. 7B is the partially enlarged three-dimensional cross-sectional view of some components of the leadframe-based semiconductor package according to the first embodiment of the present invention.
Figure 7C:
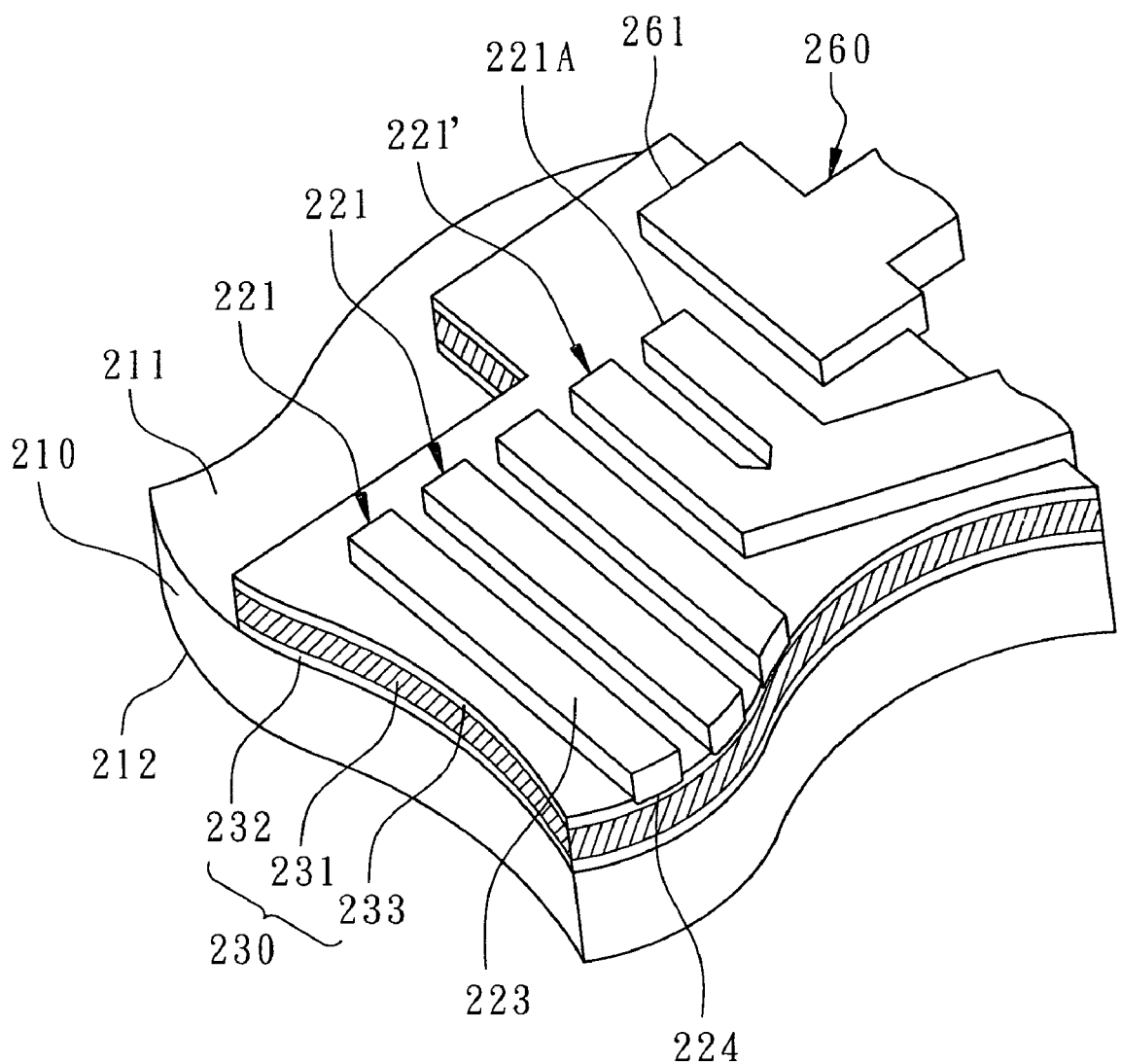
FIG. 7C is the partially enlarged three-dimensional cross-sectional view of some components of the leadframe-based semiconductor package at one side of the internal leads and the multi-layer tape according to the first embodiment of the present invention.

As shown in FIG. 7A to FIG. 7C, detailed descriptions and comparisons of the multi-layer tapes implemented in a conventional leadframe-based semiconductor package and in the one according to the present invention are revealed along with the experimental results of the maximum stresses exerted on the internal leads disposed at the corners of the packages to further manifest the effects of "reducing and redistributing the concentrated stresses exerted on the internal leads disposed at the corners of the packages" according to the present invention.

FIG. 7A is the partially enlarged three-dimensional cross-sectional view of a conventional leadframe-based semiconductor package. FIG. 7B is the partially enlarged three-dimensional cross-sectional view of the leadframe-based semiconductor package according to the first embodiment of the present invention. FIG. 7C is the partially enlarged three-dimensional cross-sectional view of the leadframe-based semiconductor package at one side of the internal leads and the multi-layer tape according to the first embodiment of the present invention.

As it was known that the lower the Young's modulus is, the easier the deformation of a material becomes. The Young's modulus for the corresponding materials are around 145,000 MPa for a metal leadframe, around 21,100 MPa for an encapsulant, around 112,000 MPa for a chip, around 8,000 MPa for the dielectric core layer of the multi-layer tape, and around 2,800 MPa for the first and second adhesive layers of the multi-layer tape. According to the modulus listed above, the multi-layer tape is more flexible than the other materials and is easily prone for deformation and can provide better stress releasing functions, especially, the adhesive layer of the multi-layer tape has the most stress releasing characters among all packaging materials. Thermal stress analyses with heating temperatures from 25° C. to 260° C. and cooling temperatures from 260° C. to 25° C. are performed. For the comparison purposes, all the simulation parameters of the packages are kept the same except the embedded depths of the internal leads 221 are different to calculate the maximum stresses exerted on the internal leads 221 disposed at the corners of the packages. The simulation results are shown in TABLE. 1 as below.

TABLE 1

The maximum stresses exerted on the internal leads disposed at the corners of the packages

| Conditions | | Peeling stresses (MPa) | X-Z shearing stresses (MPa) | Y-Z shearing stresses (MPa) |
| --- | --- | --- | --- | --- |
| Present invention | Heating | 21.75 | 3.35 | 4.03 |
| | Cooling | 168.00 | 51.21 | 64.53 |
| Conventional package | Heating | 24.13 | 5.61 | 5.45 |
| | Cooling | 182.00 | 52.78 | 66.21 |

Figure 1:
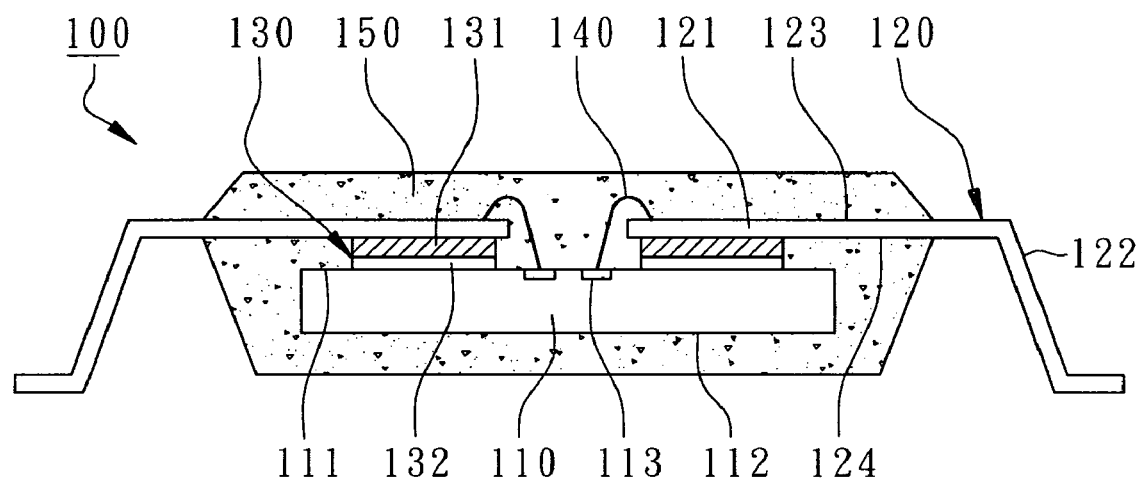
FIG. 1 is the cross-sectional view of a conventional leadframe-based semiconductor package.
Figure 2:
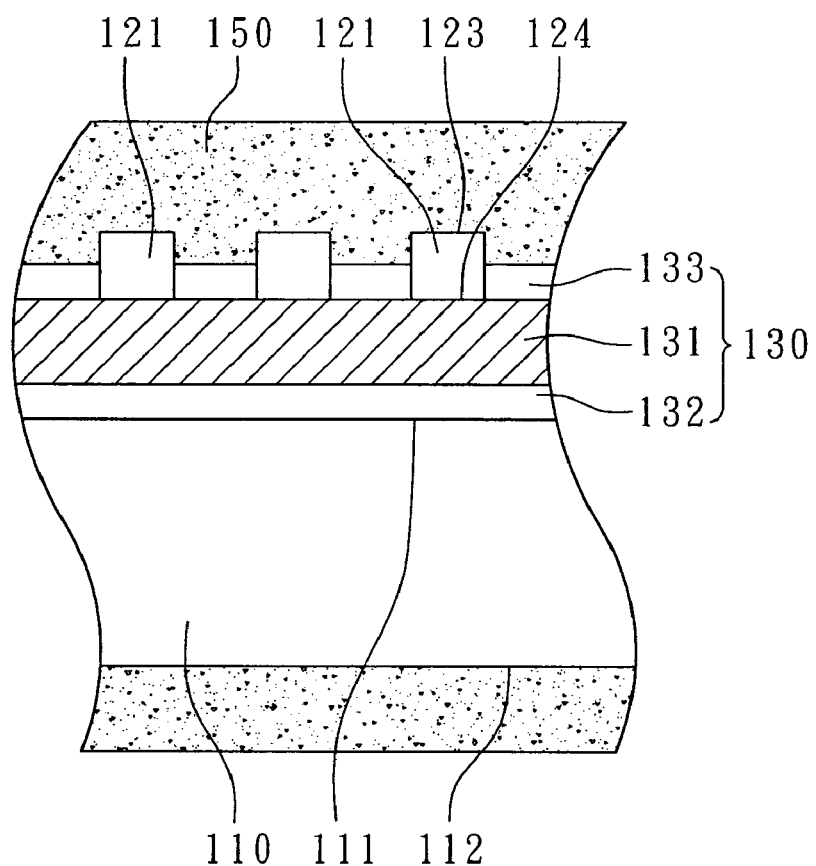
FIG. 2 is the partially enlarged cross-sectional view of a conventional leadframe-based semiconductor package across a plurality of internal leads.

As shown in FIG. 1 and FIG. 7A, the second surfaces 124 of the internal leads 121 are in direct contact with the dielectric core layer 131 of the multi-layer tape 130 according to a conventional leadframe-based semiconductor package 100. As shown in FIG. 2 and FIG. 7B, the second surface 224 of the internal leads 221 is secured by the second adhesive layer 233 of the multi-layer tape 230 to form an U-shaped bonding interface according to the leadframe-based semiconductor package 200 of the present invention. Since the Young's modulus of the second adhesive layer 233 is much smaller than the one of the dielectric core layer 231 to be softer and more flexible and the second adhesive layer 233 provides better adhesions on the bottom surfaces of the internal leads 221. One internal lead 221' of the internal leads 221 disposed at the corners of the packages, as shown in FIG. 7C, are normally experienced the maximum thermal stresses. If the thermal stresses are greater than the adhesions between the internal leads 221' and the second adhesive layer 233, the internal leads 221' will delaminate from the second adhesive layer 233. According to the present invention, the internal leads 221 are partially embedded in the second adhesive layer 233 in a manner not to directly contact the dielectric core layer 231, therefore, the stresses will be distributed in the second adhesive layer 233 with lower modulus to effectively absorb the concentrated stresses exerted on the internal leads 221' disposed at the corners of the packages where the conventional semiconductor package 100 can not achieve. As shown in TABLE. 1, the maximum stresses under heating or cooling environments exerted on the internal leads 221' of the semiconductor package 200 according to the present invention are smaller than the ones of a conventional semiconductor package 100. Therefore, from TABLE. 1, the concentrated stresses exerted on the internal leads 221' disposed at the corners of the packages are effectively reduced by using the relationship between the embedded depth and the thickness of the internal leads to enhance the package reliability. Therefore, the internal leads 221' disposed at the corners of the packages will not experience excess stresses during molding processes.

Furthermore, as shown in FIG. 7C again, the leadframe-based semiconductor package 200 further comprises a supporting bar 260 for fixing a turbulent plate to balance the mold flows, not shown in the figure. The supporting bar 260 for holding turbulent plates has an expansion terminal 261 in "T" shapes or mushroom shapes where the expansion terminal 261 is partially embedded in the second adhesive layer 233 to be firmly fixed by the multi-layer tape 230 for releasing the stresses. Preferably, the internal lead 221' disposed at the corners of the packages has a bifurcated finger 221A to make one internal lead 221' has two or more fingers integrally connected for sharing concentrated stresses. Therein, the bifurcated finger 221A is located adjacent to the expansion terminal 261 of the supporting bar 260.

Figure 8:
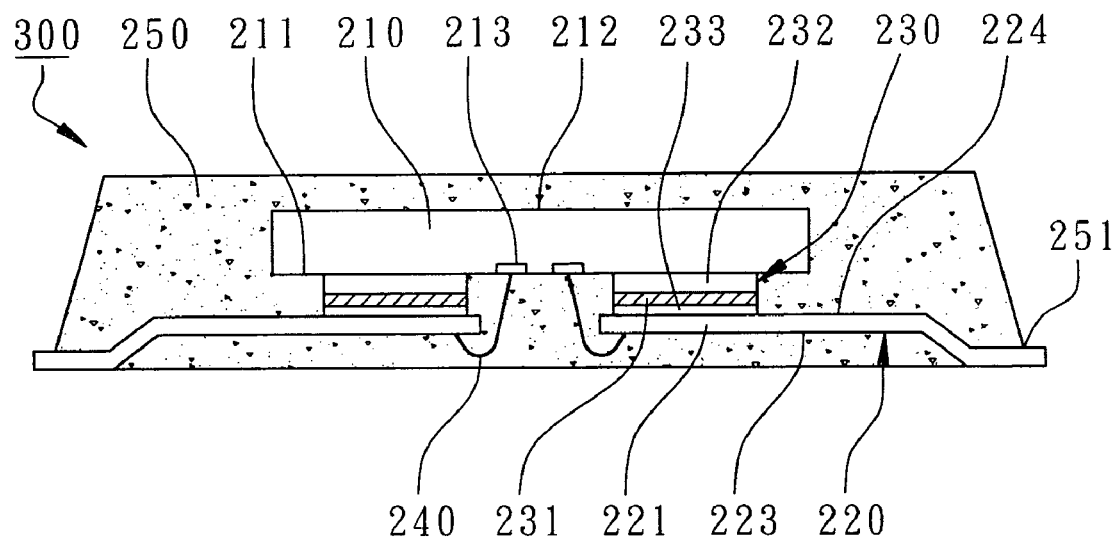
FIG. 8 is the cross-sectional view of a leadframe-based semiconductor package according to the second embodiment of the present invention.

According to the second embodiment of the present invention, a leadframe-based semiconductor package 300 is a leadless LOC semiconductor package shown in FIG. 8. Most of components are the same as the ones in the first embodiment and marked with the same component numbers. Parts of the bottom surfaces of the leads 220 of a leadframe are exposed on the bottom surface of the encapsulant 250 for external electrical connections. Therefore, the leads 220 have no external leads extended from the sides 251 of the encapsulant 250 to meet the requirements of lower package profiles, lighter weights, smaller package volume, and higher electrical performance. As shown in FIG. 5 and FIG. 6, the internal leads 221 of the leads 220 are partially embedded in the second adhesive layer 233 of the multi-layer tape 230 in a manner not to directly contact the dielectric core layer 231 of the multi-layer tape 230 to form a bonding interface with a U-shaped profile to enhance the adhesions of the leads 220 and to reduce the concentrated stresses exerted on the internal leads 221 disposed at the corners of the packages.

Figure 9:
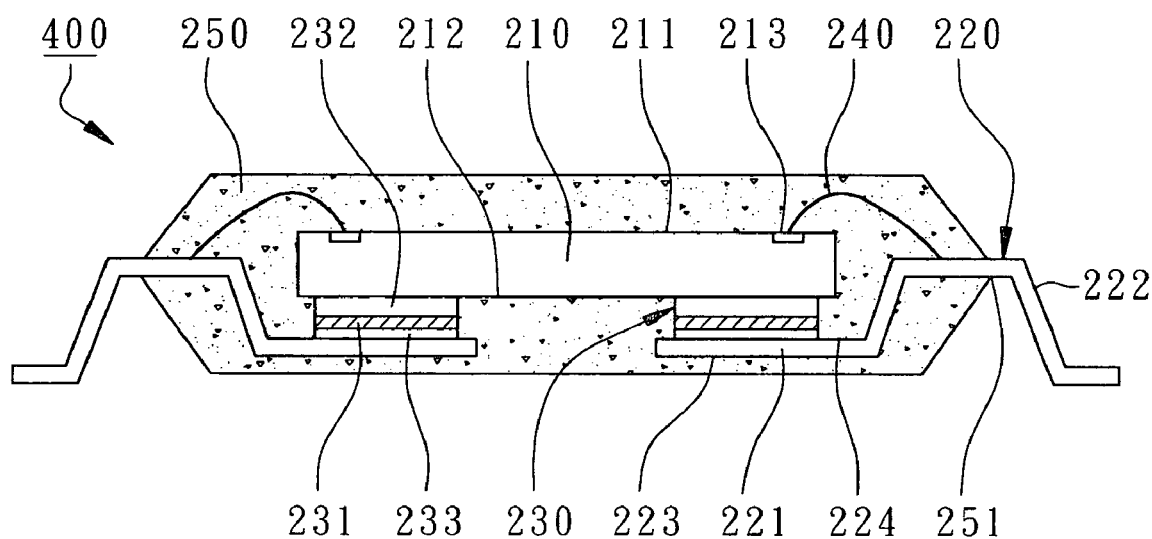
FIG. 9 is the cross-sectional view of a leadframe-based semiconductor package according to the third embodiment of the present invention.

According to the third embodiment of the present embodiment, another leadframe-based semiconductor package is revealed in FIG. 9 for a cross-sectional view where the major components are the same as the first embodiment with the same component numbers which will not describe in detail again. The leadframe-based semiconductor package 400 is a Chip-On-Lead (COL) package, primarily comprising a chip 210, a plurality of leads 220 of a leadframe, a multi-layer tape 230, a plurality of bonding wires 240, and an encapsulant 250. The active surface 211 of the chip 210 is facing upwards with the bonding pads 213 disposed by one or multiple rows at the peripheries of the active surface 221 of the chip to reduce the wire bonding lengths of the bonding wires 240. In the present embodiment, the internal leads 221 are extended onto the back surface 212 of the chip 210 where the back surface 212 of the chip is attached to the internal leads 221 to support the chip 210 by the multi-layer tape 230. Preferably, portions of the internal leads 221 at the center of the encapsulant 250 are downset to dispose the chip 210 to balance the top and bottom mold flows. The internal leads 221 are partially embedded in the second adhesive layer 233 of the multi-layer tape 230 in a manner not to directly contact the dielectric core layer 231 of the multi-layer tape 230 to enhance the adhesions of the leads 220 and to reduce the concentrated stressed exerted on the internal leads 221 disposed at the corners of the packages. During molding processes, the internal leads 221 will not be shifted nor delaminated due to the impact of the mold flows to eliminate the risk of electrical short between the internal leads 221 during semiconductor packaging processes.

The above description of embodiments of this invention is intended to be illustrative but not limiting. Other embodiments of this invention will be obvious to those skilled in the art in view of the above disclosure.

What is claimed is:

1. A leadframe-based semiconductor package, primarily comprising:
   a chip having a plurality of bonding pads;
   a plurality of leads, each having an internal lead;
   a multi-layer tape disposed on the chip and consisting of a dielectric core layer, a first adhesive layer, and a second adhesive layer opposing to the first adhesive layer, wherein the first adhesive layer is attached to one surface of the chip, and the internal leads are partially embedded in the second adhesive layer in a manner not to directly contact the dielectric core layer so that a bonding interface with a U-shaped profile is formed between the second adhesive layer and each internal lead;
   a plurality of bonding wires electrically connecting the internal leads to the bonding pads; and
   an encapsulant encapsulating the chip, the bonding wires, the multi-layer tape and the internal leads of the leads.

2. The leadframe-based semiconductor package as claimed in claim 1, wherein the attached surface of the chip is an active surface on which the bonding pads are disposed, wherein the internal leads are extended toward the bonding pads.

3. The leadframe-based semiconductor package as claimed in claim 2, wherein the bonding wires are bonded to a plurality of surfaces of the internal leads away from the bonding interface.

4. The leadframe-based semiconductor package as claimed in claim 1, wherein the attached surface of the chip is a back surface without the bonding pads, wherein the internal leads are extended onto the back surface.

5. The leadframe-based semiconductor package as claimed in claim 1, wherein the embedded depth of the internal leads in the second adhesive layer is not greater than half of the thickness of the internal leads.

6. The leadframe-based semiconductor package as claimed in claim 1, wherein the thickness of the second adhesive layer is around 25 μm and the embedded depth of the internal leads range between 5 μm to 20 μm.

7. The leadframe-based semiconductor package as claimed in claim 1, wherein the internal leads have a plurality of round angles formed at a plurality of corners of the bonding interface.

8. The leadframe-based semiconductor package as claimed in claim 3, wherein the internal leads have a plurality of punched sharp edges around the surfaces of the internal leads without embedded in the second adhesive layer.

9. The leadframe-based semiconductor package as claimed in claim 1, wherein the dielectric core layer is made of polyimide.

10. The leadframe-based semiconductor package as claimed in claim 1, wherein each lead further has a bent external lead extended from a side of the encapsulant.

11. The leadframe-based semiconductor package as claimed in claim 1, wherein the leads have no external leads.

12. The leadframe-based semiconductor package as claimed in claim 1, further comprising a supporting bar for fixing a turbulent plate, wherein the supporting bar has an expansion terminal partially embedded in the second adhesive layer.

13. The leadframe-based semiconductor package as claimed in claim 12, wherein one of the internal leads has a bifurcated finger located adjacent to the expansion terminal of the supporting bar.

14. The leadframe-based semiconductor package as claimed in claim 1, wherein a bonding gap between the partially embedded internal leads and the dielectric core layer ranges from 5 μm to 20 μm.

* * * * *